United States Patent
Choi et al.

(10) Patent No.: US 8,432,548 B2
(45) Date of Patent: Apr. 30, 2013

(54) ALIGNMENT FOR EDGE FIELD NANO-IMPRINTING

(75) Inventors: Byung-Jin Choi, Austin, TX (US); Pawan Kumar Nimmakayala, Austin, TX (US); Philip D. Schumaker, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 639 days.

(21) Appl. No.: 12/606,274

(22) Filed: Oct. 27, 2009

(65) Prior Publication Data

US 2010/0110434 A1   May 6, 2010

Related U.S. Application Data

(60) Provisional application No. 61/111,102, filed on Nov. 4, 2008.

(51) Int. Cl.
| | |
|---|---|
| G01B 11/00 | (2006.01) |
| B41F 1/34 | (2006.01) |
| B41F 21/12 | (2006.01) |
| B41F 21/14 | (2006.01) |
| B41L 1/02 | (2006.01) |
| B41L 3/02 | (2006.01) |

(52) U.S. Cl.
USPC ........... 356/401; 101/485; 101/486; 264/406; 264/408; 425/150; 430/22; 430/30

(58) Field of Classification Search .......... None
See application file for complete search history.

(56) References Cited

U.S. PATENT DOCUMENTS

| | | | |
|---|---|---|---|
| 4,869,998 A * | 9/1989 | Eccles et al. | 430/311 |
| 6,018,395 A | 1/2000 | Mori et al. | |
| 6,071,656 A * | 6/2000 | Lin | 430/22 |
| 6,277,532 B1 * | 8/2001 | Yahiro | 430/30 |
| 6,368,761 B1 * | 4/2002 | Chien et al. | 430/22 |
| 6,466,301 B1 * | 10/2002 | Yui et al. | 355/53 |
| 6,724,096 B2 * | 4/2004 | Werner et al. | 257/797 |
| 6,826,738 B2 * | 11/2004 | Cadouri | 716/54 |
| 6,842,229 B2 | 1/2005 | Sreenivasan et al. | |
| 6,873,087 B1 | 3/2005 | Choi et al. | |
| 6,902,853 B2 | 6/2005 | Sreenivasan et al. | |
| 6,908,830 B2 * | 6/2005 | Lu et al. | 438/426 |
| 6,916,584 B2 | 7/2005 | Sreenivasan et al. | |
| 6,921,615 B2 | 7/2005 | Sreenivasan et al. | |
| 6,922,906 B2 | 8/2005 | Choi et al. | |
| 6,954,275 B2 | 10/2005 | Choi et al. | |
| 7,027,156 B2 | 4/2006 | Watts et al. | |
| 7,033,847 B2 * | 4/2006 | Tai et al. | 438/15 |

(Continued)

FOREIGN PATENT DOCUMENTS

| | | |
|---|---|---|
| JP | 2005167030 | 6/2005 |
| WO | 9810121 | 3/1998 |
| WO | 2009073206 | 6/2009 |

OTHER PUBLICATIONS

Choi et al. Layer-to-Layer Alignment for Step and Flash Imprint Lithography, SPIE's 26th Intl. Symp. Microlithography: Emerging Lithographic Technologies, Santa Clara, CA Mar. 1, 2001.

*Primary Examiner* — Gordon Stock, Jr.
(74) *Attorney, Agent, or Firm* — Cameron A. King (57) ABSTRACT

Systems and methods for alignment of template and substrate at the edge of substrate are described.

17 Claims, 9 Drawing Sheets

U.S. PATENT DOCUMENTS

| | | |
|---|---|---|
| 7,070,405 B2 | 7/2006 | Sreenivasan et al. |
| 7,170,589 B2 | 1/2007 | Cherala et al. |
| 7,186,483 B2 | 3/2007 | Sreenivasan et al. |
| 7,245,358 B2 | 7/2007 | Nimmakayala et al. |
| 7,281,921 B2 | 10/2007 | Watts et al. |
| 7,292,326 B2 | 11/2007 | Nimmakayala et al. |
| 7,303,383 B1 | 12/2007 | Sreenivasan et al. |
| 7,323,130 B2 | 1/2008 | Nimmakayala et al. |
| 7,353,077 B2 * | 4/2008 | Lin et al. .................... 700/121 |
| 7,388,663 B2 * | 6/2008 | Gui ............................. 356/401 |
| 7,670,529 B2 | 3/2010 | Choi et al. |
| 2003/0003677 A1 | 1/2003 | Fukada |
| 2004/0022888 A1 * | 2/2004 | Sreenivasan et al. ...... 425/174.4 |
| 2004/0096759 A1 | 5/2004 | Barber |
| 2004/0149687 A1 | 8/2004 | Choi et al. |
| 2004/0163563 A1 | 8/2004 | Sreenivasan et al. |
| 2004/0180276 A1 * | 9/2004 | Tai et al. ....................... 430/30 |
| 2005/0064344 A1 | 3/2005 | Bailey et al. |
| 2005/0269745 A1 | 12/2005 | Cherala et al. |
| 2005/0270516 A1 | 12/2005 | Cherala et al. |
| 2005/0271955 A1 | 12/2005 | Cherala et al. |
| 2006/0108541 A1 * | 5/2006 | Koike ........................ 250/491.1 |
| 2006/0114450 A1 | 6/2006 | Nimmakayala et al. |
| 2006/0115999 A1 | 6/2006 | Sreenivasan et al. |
| 2006/0126058 A1 | 6/2006 | Nimmakayala et al. |
| 2007/0228609 A1 | 10/2007 | Sreenivasan et al. |
| 2007/0228610 A1 | 10/2007 | Sreenivasan et al. |
| 2007/0231421 A1 | 10/2007 | Nimmakayala et al. |
| 2007/0243655 A1 | 10/2007 | Schmid et al. |
| 2008/0153312 A1 | 6/2008 | Sreenivasan et al. |
| 2008/0204693 A1 | 8/2008 | Nimmakayala et al. |
| 2008/0204696 A1 * | 8/2008 | Kamijima ........................ 355/77 |
| 2009/0026657 A1 | 1/2009 | Nimmakayala et al. |
| 2009/0147237 A1 | 6/2009 | Schumaker et al. |
| 2009/0250840 A1 | 10/2009 | Selinidis et al. |
| 2010/0099259 A1 | 4/2010 | Selinidis et al. |

* cited by examiner

ALIGNMENT FOR EDGE FIELD NANO-IMPRINTING

CROSS-REFERENCE TO RELATED APPLICATIONS

This application claims the benefit under 35 U.S.C. §119 (e)(1) of U.S. Provisional Patent Application No. 61/111,102, filed Nov. 4, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable layer (polymerizable) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
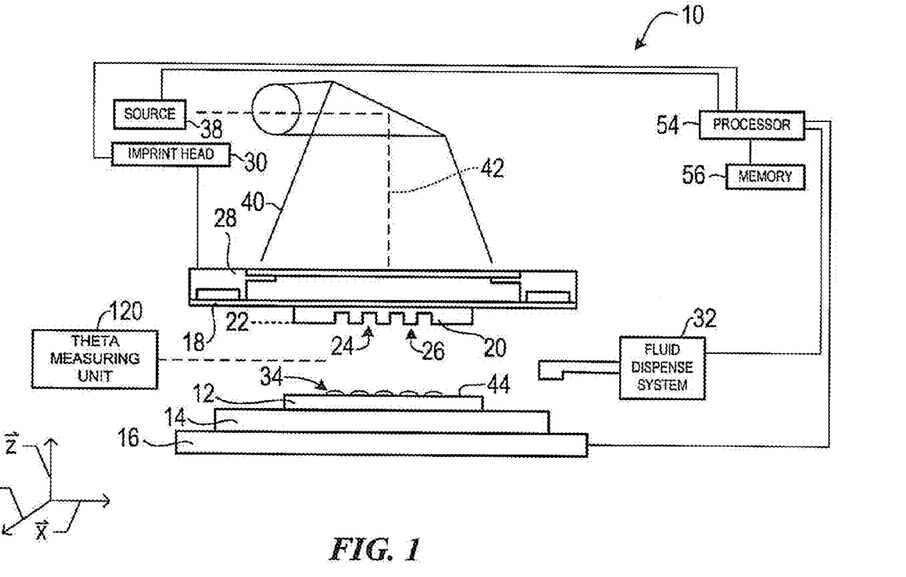
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Patterning surface 22 may be used to pattern a single field on template 18 using a step-and-repeat process as described herein. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
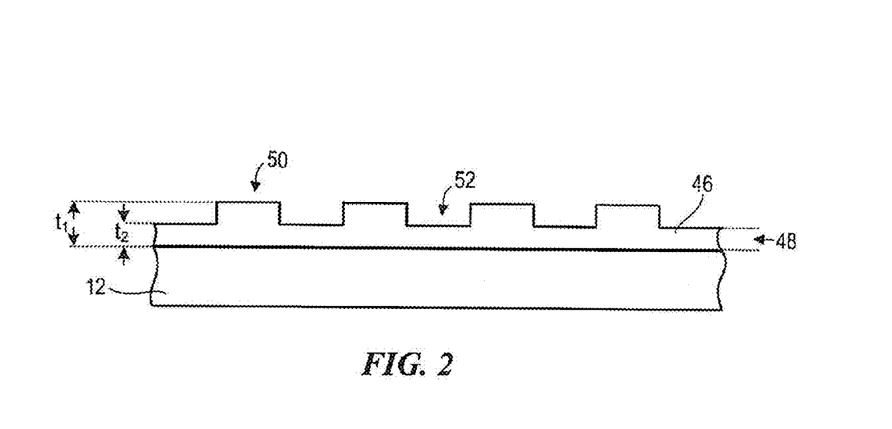
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$. Template 18 may be separated from patterned layer 46 may used to pattern another field in a step-and-repeat process.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Figure 3:
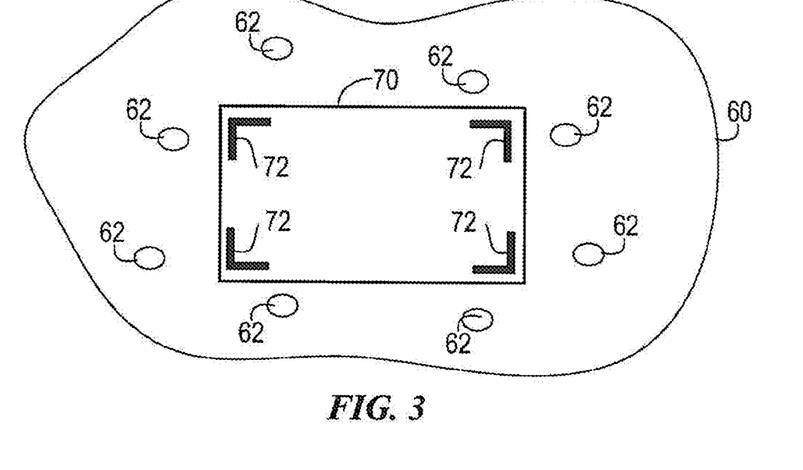
FIG. 3 illustrates a simplified top down view of an alignment system having multiple alignment measurement units about a field.

Ascertaining a desired alignment between template 18 and a field of substrate 12 may aid in the facilitation of pattern transfer between template 18 and substrate 12. To facilitate alignment, an alignment system utilizing alignment marks on the template 18 and/or substrate 12 may be used with one alignment mark of the pair being disposed on the template 18, and the remaining alignment mark being positioned on the substrate 12. FIG. 3 illustrates a simplified view of an alignment system 60 having multiple alignment measurement units 62 (e.g., microscopes). Examples of alignment marks and alignment systems 60 for use in imprint lithography processes are described in detail in U.S. Pat. Nos. 7,136,150, and 7,070,405, 6,916,584, and U.S. Patent Publication No. 2007/0231421, all of which are hereby incorporated by reference.

Figure 4:
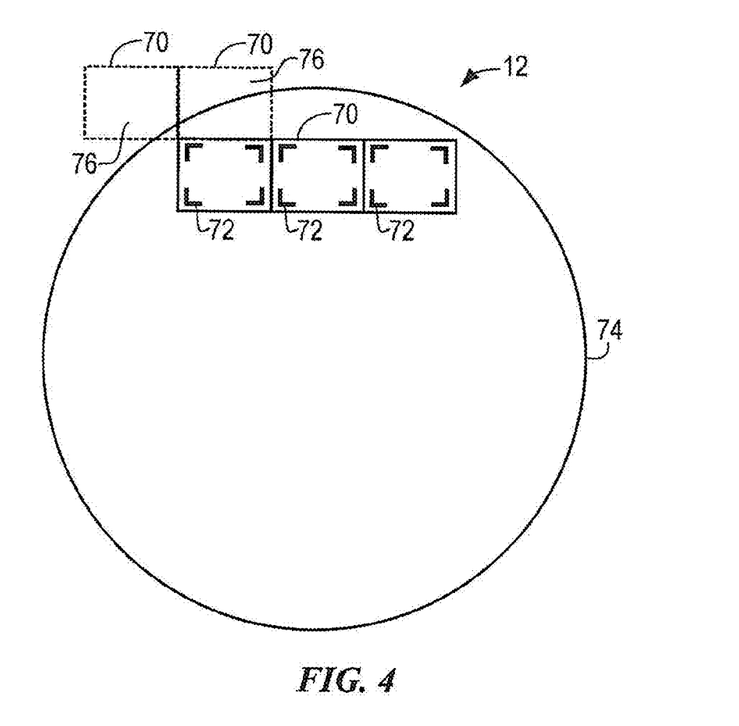
FIG. 4 illustrates a simplified top down view of a substrate.

Alignment system 60 may be used for a field-by-field alignment process. As illustrated in FIGS. 1, 3, and 4, during imprinting, stage 16 may be moved such that template 18 is oriented over the desired field 70 of the substrate 12 based on coordinates stored in memory 54. Each field 70 of the substrate 12 may include two or more alignment marks 72 corresponding to alignment marks on the template 18. The alignment marks on the template 18 may then be aligned with alignment marks 72 at a specific field 70 being imprinted on the substrate 12. Once the field 70 is imprinted, stage 16 may be moved to orient template 18 over another field 70 of the substrate 12. As such, alignment may be conducted within individual fields 70 of the substrate 12. On the edge 74 of substrate 12, however, portions 76 of fields 70 may be outside of the area of substrate 12 leading to alignment error on edge 74 of substrate 12 and, as such, a decrease in die yield.

Reconfigurable Alignment System

Figure 5A:
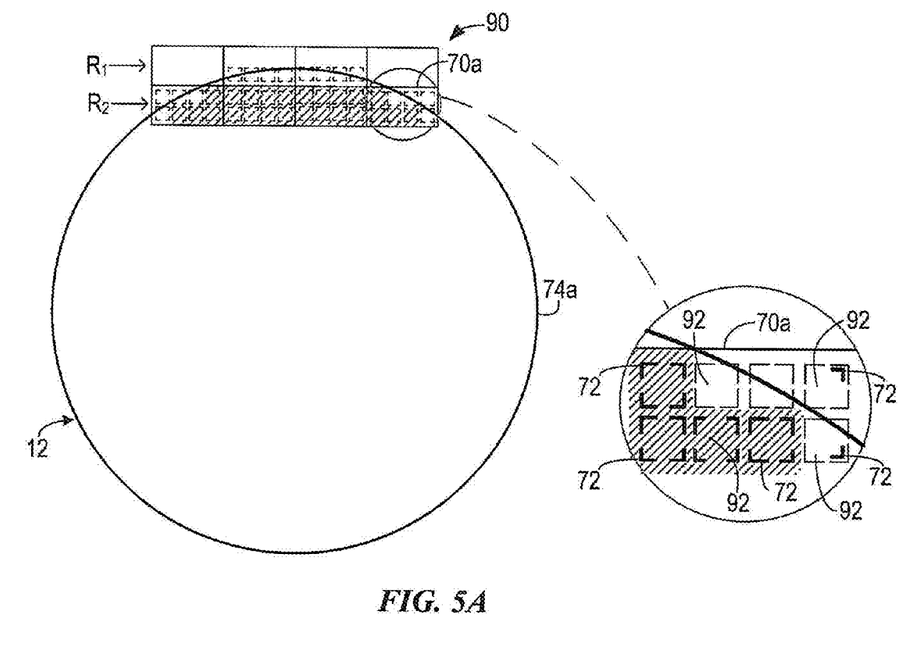
FIGS. 5A-5E illustrate exemplary reconfigurable alignment systems.
Figure 5B:
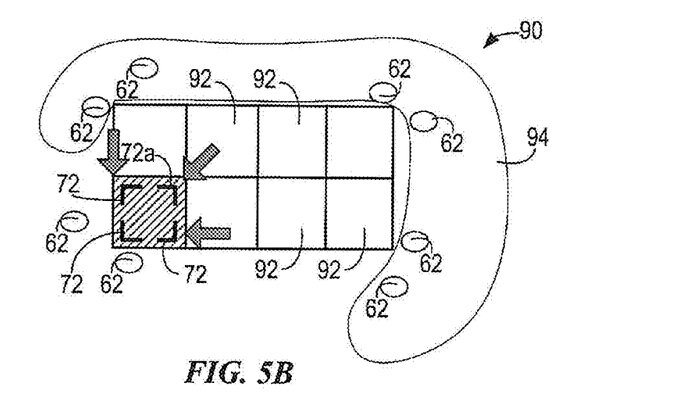

FIGS. 5A and 5B illustrate an exemplary reconfigurable alignment system 90. Generally, in system 90, alignment marks 72a may be present, not only at the corners of field 70a, but also may be present within each sub-field 92 of field 70a.

Field 70a may be divided according to the number of sub-fields 92 within field 70a. For example, in FIG. 5A, field 70a includes eight possible sub-fields 92; however, any number of sub-fields 92 may be within field 70a depending on design considerations. Each sub-field 92 may include one or more potentially yielding dies.

Further, each sub-field 92 may contain multiple alignment marks 72a. Placement of alignment marks 72a within field 70a and/or sub-field 92 may be designed to limit the surface area allocated to alignment marks 72a on substrate 12. In one example, alignment marks 72a may be within each corner of the sub-field 92. In another example, alignment marks 72a may be placed in a gap between sub-fields 92. In another example, alignment marks 72a may be placed in a gap between potentially yielding dies.

At the edge of substrate 12, not all sub-fields 92 provide yielding dies as described above. As illustrated in FIG. 5A, potentially yielding sub-fields 92 are marked with hatched box. In this example, row $R_1$ provides for no potentially yielding sub-fields 92. In the magnification of field 70a on the edge 74a, only four of the eight sub-fields 92 may be considered potentially yielding sub-fields.

In one example, alignment measurement system 90 may be reconfigured to detect alignment marks 72a in potentially yielding sub-fields 92 in addition to or in lieu of alignment marks 72 of field 70. Generally, alignment measurement system 90 is configured to not only detect alignment marks 72 within one or more corners of field 90, but also is configured to detect alignment marks 72a within sub-fields 92. As illustrated in FIG. 5B, alignment measurement units 62 within region 94 may be re-configured to detect alignment marks 72a within the potentially yielding sub-field 92 in addition to or in lieu of alignment marks 70 of field 90. For example, alignment measurement units 62 may be moveably positioned (e.g., movement in x, y or z direction to physically relocate to be in optical communication with at least one alignment mark 72a suitable for detection) and/or reconfigured (e.g., configured with additional hardware to provide optical communication with at least one alignment mark 72a suitable for detection).

Figure 5C:
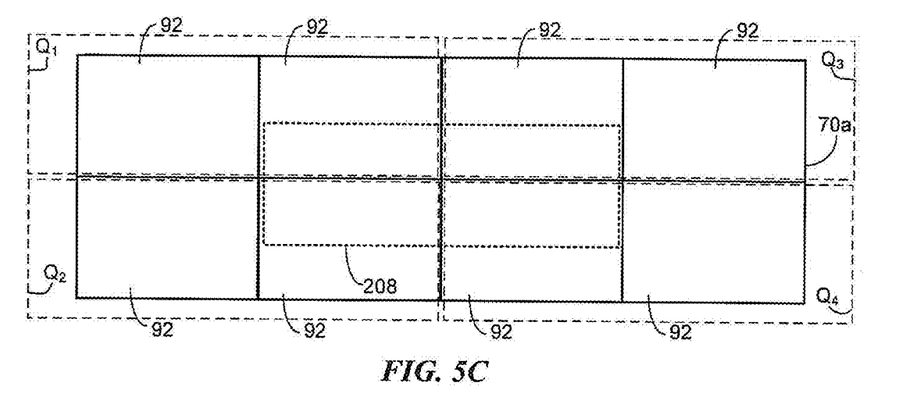
Figure 5D:
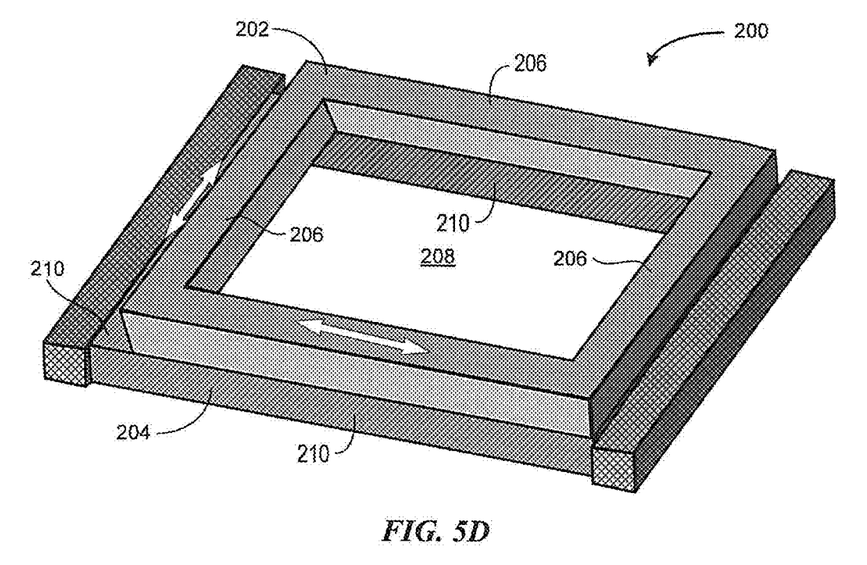

In another example, as illustrated in FIGS. 5B-5D, re-configuration of the alignment measurement system 90 may be in a pattern 208 that provides for detection of one or more sub-fields 92. For example, in FIG. 5C, field 70a may be divided into four quadrants, Q1, Q2, Q3, and Q4. Each quadrant Q may be formed of at least two sub-fields 92. The alignment measurement system 90 may be re-configured to a pattern 208 that provides for detection of a quadrant Q. The alignment measurement system 90 may then be moved to each quadrant $Q_{1-4}$ to detect alignment marks within each sub-field 92.

To facilitate movement without increasing particle generation and/or to increase throughput, alignment measurement system 90 may driven by a scanning stage 200 as illustrated in FIG. 5D. Alignment measurement system 90 or portions of alignment measurement system 90 may be fixably connected to scanning stage 200.

Scanning stage 200 may comprise a first direction stage 202 (e.g., X stage) adjacent to a second direction stage 204 (e.g., Y stage). X stage 202 may include a plurality of sides 206. Sides 206 may be positioned about an open area 208. Sides 206 may form any shape formation including, but limited to, square, rectangle, hexagonal, circular, and/or any fanciful shape. Y stage 204 may includes a plurality of side 210. Sides 210 may be positioned about open area 208. Sides 210 may form any shape formation including, but limited to, square, rectangle, hexagonal, circular, and/or any fanciful shape. Shape formation of sides 210 may be similar to shape of sides 206 or different from shape of sides 206.

Figure 5E:
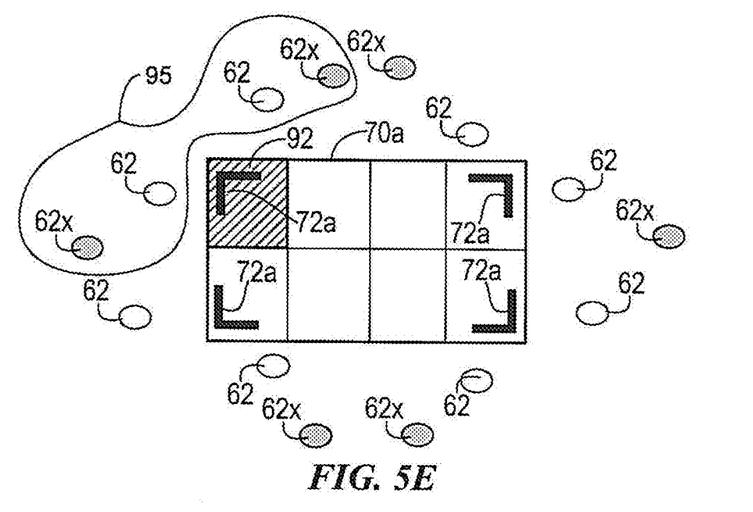

In another example, as illustrated in FIG. 5E, one or more additional alignment measurement units 62x may be added to alignment measurement system 60 shown in FIG. 3. Typical numbers and placement of alignment measurement units 62 are further described in U.S. Pat. No. 7,292,326 and U.S. Ser. No. 11/000,321, which are both hereby incorporated by reference in their entirety. Additional alignment measurement units 62x may be introduced into the systems described in these references and configured to detect alignment marks 72a positioned within sub-fields 92. For example, as illustrated in FIG. 5E, alignment measurement units 62 and 62x within region 95 may be configured to detect alignment marks 72a in the potentially yielding sub-field 92.

Figure 6:
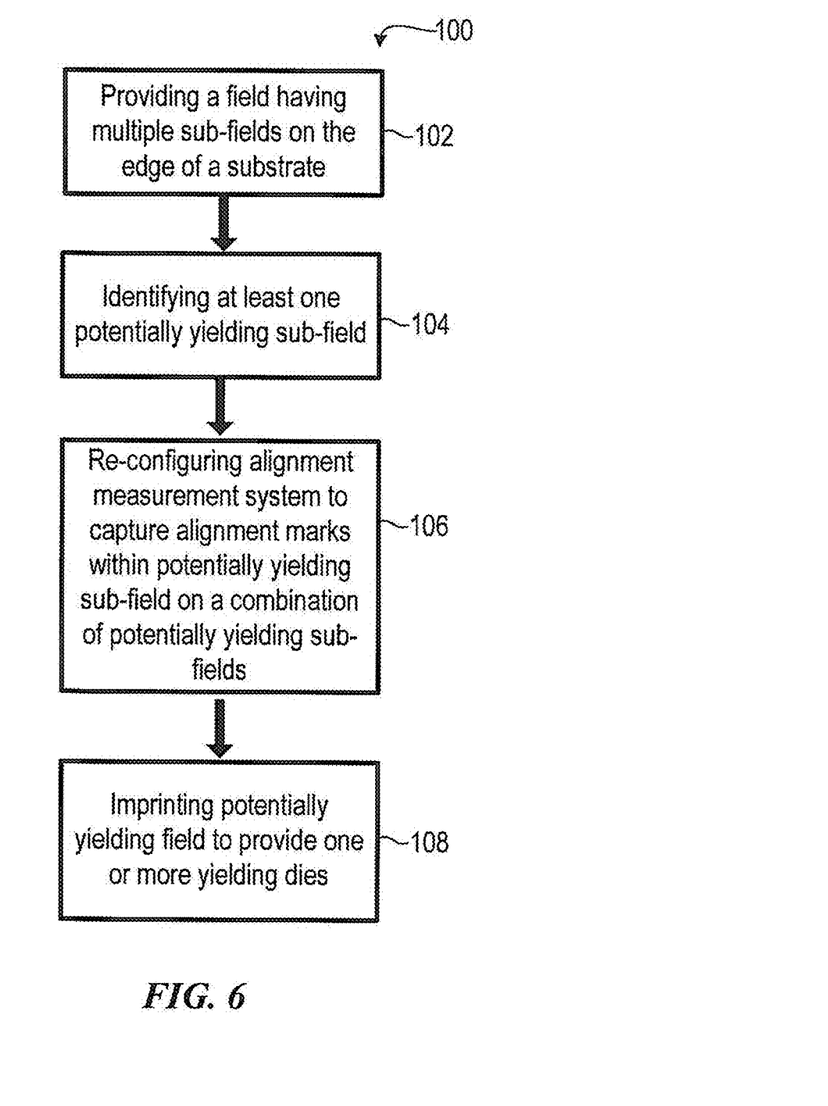
FIG. 6 illustrates a flow chart of an exemplary method for aligning a template and a substrate.

FIG. 6 illustrates a flow chart of an exemplary method 100 for aligning template 18 and substrate 12. In a step 102, a field 70 having multiple sub-fields 92 on the edge 74a of substrate 12 may be provided. Alignment system 90 may be configured to be in optical communication with alignment marks 72 of field 70. Alignment marks 72 may be positioned at outer boundary of field 70. Each sub-field 92 may comprise multiple alignment marks 72a. In a step 104, at least one potentially yielding sub-field 92 may be identified. Potentially yielding sub-fields 92 may have one or more potentially yielding dies. In a step 106, alignment measurement system 90 may be re-configured such that alignment measurement units 62 capture alignment marks 72a within potentially yielding sub-field 92 or a combination of one or more potentially yielding sub-fields 92. For example, alignment measurement system 90 may be repositioned to be in optical communication with alignment marks 72a of the potentially yielding sub-field 92. In one embodiment, alignment measurement system 90 may be repositioned in optical communication with alignment marks 72a but outside of a beam path from an energy source focused through template 18 for solidification of polymerizable material 34. In a step 108, potentially yielding field 70a may be imprinted to provide for one or more yielding dies with suitable alignment. For example, alignment data from phase information using alignment marks 72a of sub-field of substrate 12 and overlaying template alignment marks may be collected. Images (e.g., moiré first order microscope images) may be captured by diffracting light from one of alignment marks 72a or template alignment marks. Normal distance between alignment marks 72a and template alignment marks may be altered (e.g., from 100 microns to less than 10 nm). Relative spatial parameters (e.g., alignment, magnification, distortion parameters, and the like) between substrate 12 and template 18 may be determined using the images. Using the relative spatial parameters, template 18 may align with sub-field 92 of substrate 12. Polymerizable material 34 may be deposited on area in superimposition with sub-field 92 of substrate. Template 18 may be positioned in contact with polymerizable material 34 and polymerizable material 34 may conform between template 18 and substrate 12. Polymerizable material 34 may be solidified forming patterned layer 46. Template 18 may be separated from polymerizable material 34 forming potentially yielding die in sub-field 92.

Independent Theta Measurement

Figure 7:
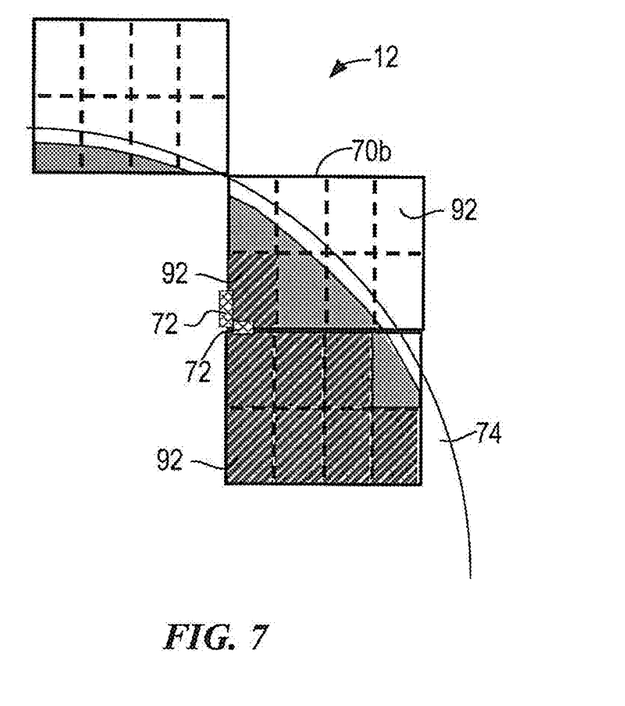
FIG. 7 illustrates a simplified top down view of a portion of a substrate.

Referring to FIGS. 1, 3 and 7, alignment between template 18 and substrate 12 on edge 74 of substrate 12 may include the use of alignment system 60 or 90 and a theta measuring unit 120. Exemplary theta measuring units 120 may include laser interferometers, capacitance sensors, and/or any other precision sensors having a pre-determined accuracy. Generally, at least two alignment marks 72 and/or alignment marks 72a within each field 70 or sub-field 92 may provide X and Y values for alignment. For example, as shown in the figures, alignment marks 72 may provide X and Y values for field 70b. Data obtained from the theta measuring unit 120 may be combined with the X and Y values to provide sufficient data for alignment of x, y, and theta. It should be noted that by using only x, y and theta, magnification detection may be eliminated in sub-field 92 alignment.

Figure 8:
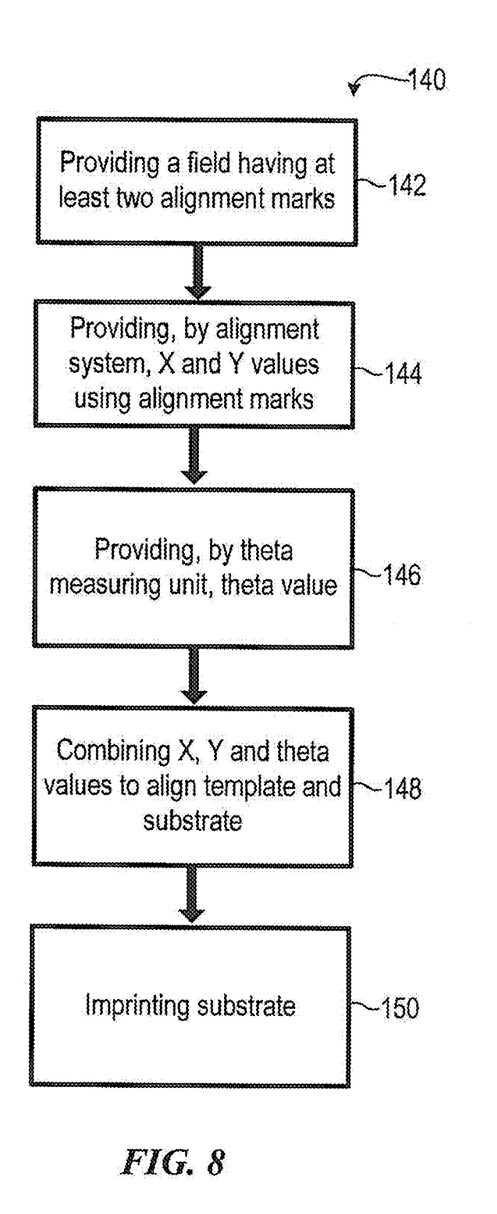
FIG. 8 illustrates a flow chart of an exemplary method for aligning a template and a substrate.

FIG. 8 illustrates an exemplary method 140 for aligning template 18 and substrate 12 using a theta measuring unit 120. In a step 142, at least one field 70b having at least two alignment marks 72 may be provided. In a step 144, alignment system 60 or 90 may provide X and Y values using alignment marks 72. In a step 146, theta measuring unit 120 may provide the theta value. In a step 148, X, Y, and theta values may be combined to provide for alignment of template 18 and substrate 12. In a step 150, substrate may be imprinted.

Neighboring Field Alignment

Figure 9:
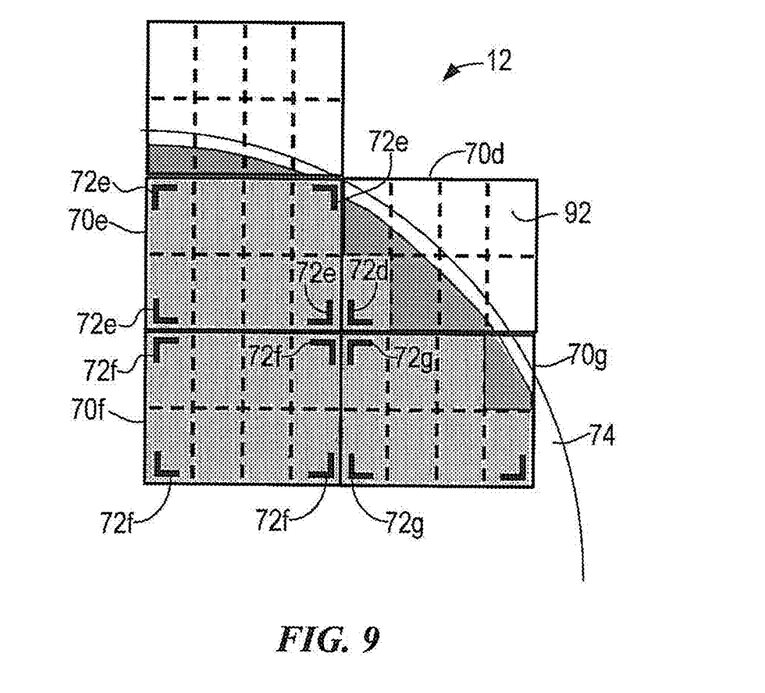
FIG. 9 illustrates a simplified top down view of a portion of a substrate.

Referring to FIGS. 1, 3 and 9, alignment between template 18 and substrate 12 on edge 74 of substrate 12 may include the use of alignment marks 72 on adjacent fields 70. For example, as illustrated in FIG. 9, alignment on the edge 74 of substrate 12 may contain a field 70d having a potentially yielding sub-field 92. As the potentially yielding sub-field 92 may only contain one viable alignment mark 72d, alignment marks 72e, 72f, and/or 72g from adjacent fields 70e, 70f, and/or 70g may be used to facilitate alignment between template 18 and substrate 12 for imprinting potentially yielding field 70d.

What is claimed is:

1. A method, comprising:
positioning alignment measurement units in optical communication with a first set of field alignment marks on a first field of a substrate, the first field having a plurality of sub-fields with each sub-field having a second set of sub-field alignment marks contained within each sub-field;
identifying one or more potentially yielding sub-fields within the field;
retaining at least one alignment measurement unit in optical communication with at least one field alignment mark; and,
repositioning one or more alignment measurement units to be in optical communication with one or more of the second set of alignment marks contained within the one or more potentially yielding sub-fields.

2. The method of claim 1, wherein alignment marks of the first set are positioned on outer boundaries of the field.

3. The method of claim 1, wherein alignment marks of the second set are positioned on outer boundaries of the sub-field.

4. The method of claim 1, wherein alignment measurement units are repositioned outside of a beam path from an energy source focused through a template.

5. The method of claim 1, further comprising repositioning one or more alignment measurement units to be in optical communication with a third set of alignment marks of a second field, the second field positioned adjacent to the first field.

6. The method of claim 1, further comprising providing one or more additional alignment measurement units in optical communication with second set of alignment marks.

7. The method of claim 1, wherein the alignment measurement units are positioned on a scanning stage.

8. The method of claim 1, further comprising collecting alignment data from phase information using the second set of alignment marks and overlaying template alignment marks positioned on an imprint lithography template.

9. The method of claim 7, wherein the scanning stage includes a first direction stage and a second direction stage, the first direction stage and the second direction stage each having an open area, the open area providing a beam path for an energy source focused through the substrate.

10. The method of claim 8, further comprising capturing images by diffracting light from one of the second set of alignment marks or the overlaying template alignment marks.

11. The method of claim 9, wherein the first direction stage is adapted to reposition alignment measurement units in an x-direction.

12. The method of claim 9, wherein the second direction stage is adapted to reposition alignment measurement units in a y-direction.

13. The method of claim 10, wherein normal distance between the second set of alignment marks and the template overlaying template alignment marks may be altered from 100 microns to less than 10 nm.

14. The method of claim 10, further comprising determining relative spatial parameters between the substrate and the imprint lithography template using the images.

15. The method of claim 14, wherein the spatial parameters include alignment parameters and exclude magnification parameters.

16. The method of claim 15, wherein the second set of alignment marks provides X and Y values for alignment.

17. The method of claim 16, further comprising determining theta value using a theta measuring unit.

* * * * *